US010270425B2

(12) United States Patent
Iwaki et al.

(10) Patent No.: US 10,270,425 B2
(45) Date of Patent: Apr. 23, 2019

(54) ACOUSTIC WAVE RESONATOR, FILTER, AND MULTIPLEXER

(71) Applicant: TAIYO YUDEN CO., LTD., Tokyo (JP)

(72) Inventors: Masafumi Iwaki, Tokyo (JP); Takashi Matsuda, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/599,367

(22) Filed: May 18, 2017

(65) Prior Publication Data

US 2017/0373669 A1    Dec. 28, 2017

(30) Foreign Application Priority Data

Jun. 22, 2016   (JP) ................................. 2016-123972

(51) Int. Cl.
*H03H 9/64*     (2006.01)
*H03H 9/145*    (2006.01)
(Continued)

(52) U.S. Cl.
CPC ...... *H03H 9/6489* (2013.01); *H03H 9/02944* (2013.01); *H03H 9/1457* (2013.01);
(Continued)

(58) Field of Classification Search
CPC .. H03H 9/64; H03H 7/12; H03H 9/17; H03H 9/54
(Continued)

(56) References Cited

U.S. PATENT DOCUMENTS

| 9,654,084 B2 * | 5/2017 | You ......................... H03H 9/64 |
| 2011/0063047 A1 * | 3/2011 | Okuda ................. H03H 9/0222 333/133 |
| 2013/0234805 A1 * | 9/2013 | Takahashi .......... H03H 9/02228 333/133 |

FOREIGN PATENT DOCUMENTS

| JP | S61-6917 A | 1/1996 |
| JP | 9-270667 A | 10/1997 |

(Continued)

OTHER PUBLICATIONS

Trzcinski, "Surface Acoustic Wave (SAW) filter technology", Torino, 2008.*

(Continued)

*Primary Examiner* — Benny T Lee
*Assistant Examiner* — Hafizur Rahman
(74) *Attorney, Agent, or Firm* — Chen Yoshimura LLP

(57) ABSTRACT

An acoustic wave resonator includes: a piezoelectric substrate; and a pair of grating electrodes that is formed on the piezoelectric substrate, one of the pair of grating electrodes including a plurality of first electrode fingers having electric potentials equal to each other, another of the pair of grating electrodes including a plurality of second electrode fingers having electric potentials that differ from the electric potentials of the plurality of first electrode fingers and are equal to each other, two second electrode fingers of the plurality of second electrode fingers being located between at least a pair of adjacent first electrode fingers of the plurality of first electrode fingers, Pg differing from $\lambda/4$ where $\lambda$ represents a wavelength of an acoustic wave excited by the plurality of first electrode fingers and the plurality of second electrode fingers and Pg represents a distance between centers of the two second electrode fingers.

12 Claims, 12 Drawing Sheets

(51) Int. Cl.
  *H03H 9/25*  (2006.01)
  *H03H 9/02*  (2006.01)

(52) U.S. Cl.
  CPC .... *H03H 9/14535* (2013.01); *H03H 9/14541* (2013.01); *H03H 9/14552* (2013.01); *H03H 9/25* (2013.01)

(58) Field of Classification Search
  USPC .......................................................... 333/174
  See application file for complete search history.

(56) References Cited

FOREIGN PATENT DOCUMENTS

| | | |
|---|---|---|
| JP | 2000-124763 A | 4/2000 |
| JP | 2003-298383 A | 10/2003 |
| JP | 2008-78883 A | 4/2008 |

OTHER PUBLICATIONS

Tyagi et al., "Saw and Interdigital Transducers", a research paper published by International Journal of Scientific & Engineering Research, IJSER 2012, pp. 1-5.*

Nakamura et al., "A review of SiO2 thin film technology for temperature compensated SAW devices", Sixth International Symposium on Acoustic Wave Devices for future Mobile Communication Systems, Nov. 2015, Chiba, Japan, pp. 67-71.*

Japanese Office Action dated Dec. 4, 2018, in a counterpart Japanese patent application No. 2016-123972. (A machine translation (not reviewed for accuracy) attached.).

* cited by examiner

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2016-123972, filed on Jun. 22, 2016, the entire contents of which are incorporated herein by reference.

FIELD

A certain aspect of the present invention relates to an acoustic wave resonator, a filter, and a multiplexer.

BACKGROUND

In high-frequency communication systems typified by mobile phones, high-frequency filters have been used to remove unnecessary signals other than signals in the frequency band used for communications. Acoustic wave resonators such as surface acoustic wave (SAW) resonators have been used for the high-frequency filters. In the SAW resonator, a metal grating electrode is formed on a piezoelectric substrate such as a lithium tantalate ($LiTaO_3$) substrate or a lithium niobate ($LiNbO_3$) substrate.

The grating electrode excites a Shear Horizontal (SH) wave, a Rayleigh wave, or a boundary acoustic wave, which is a type of surface acoustic wave. Reflectors are located at both sides in the propagation direction of the acoustic wave excited by the grating electrode to confine the acoustic wave in the vicinity of the grating electrode. Ladder-type filters and multimode filters can be made with acoustic wave resonators. There have been known acoustic wave resonators in which the width in the direction perpendicular to the propagation direction of the acoustic wave is weighted in the grating electrode as disclosed in, for example, Japanese Patent Application Publication Nos. 9-270667 and 2008-78883 (hereinafter, referred to as Patent Documents 1 and 2, respectively).

In acoustic wave resonators having a grating electrode, lateral-mode spurious, which is unnecessary response, is generated. The lateral-mode spurious is generated when the acoustic waves each having a component in the direction perpendicular to the propagation direction of the acoustic wave amplify each other at a certain wavelength. In Patent Documents 1 and 2, since the overlap width changes in the propagation direction of the acoustic wave, the frequency at which the lateral-mode spurious is generated changes in the propagation direction. Accordingly, the frequencies at which the acoustic waves in the lateral mode amplify each other are averaged, and thereby, the lateral-mode spurious is reduced. However, this does not mean that the generation of the acoustic wave in the lateral mode is inhibited. Therefore, the acoustic wave in the lateral mode leaks to the outside of the grating electrode, causing loss.

SUMMARY OF THE INVENTION

According to a first aspect of the present invention, there is provided an acoustic wave resonator including: a piezoelectric substrate; and a pair of grating electrodes that is formed on the piezoelectric substrate, one of the pair of grating electrodes including a plurality of first electrode fingers having electric potentials equal to each other, another of the pair of grating electrodes including a plurality of second electrode fingers having electric potentials that differ from the electric potentials of the plurality of first electrode fingers and are equal to each other, two second electrode fingers of the plurality of second electrode fingers being located between at least a pair of adjacent first electrode fingers of the plurality of first electrode fingers, Pg differing from $\lambda/4$ where $\lambda$ represents a wavelength of an acoustic wave excited by the plurality of first electrode fingers and the plurality of second electrode fingers and Pg represents a distance between centers of the two second electrode fingers.

According to a second aspect of the present invention, there is provided an acoustic wave resonator including: a piezoelectric substrate; a pair of grating electrodes that is formed on the piezoelectric substrate and includes a plurality of electrode fingers arranged in an arrangement direction, the plurality of electrode fingers exciting an acoustic wave; and a metal additional film that is formed on the piezoelectric substrate between the plurality of electrode fingers in an overlap region where the plurality of electrode fingers overlap in the arrangement direction, the metal additional film being not electrically coupled to the plurality of electrode fingers.

According to a third aspect of the present invention, there is provided a filter including the above acoustic wave resonator.

According to a fourth aspect of the present invention, there is provided a multiplexer including the above filter.

DETAILED DESCRIPTION

Figure 1A:
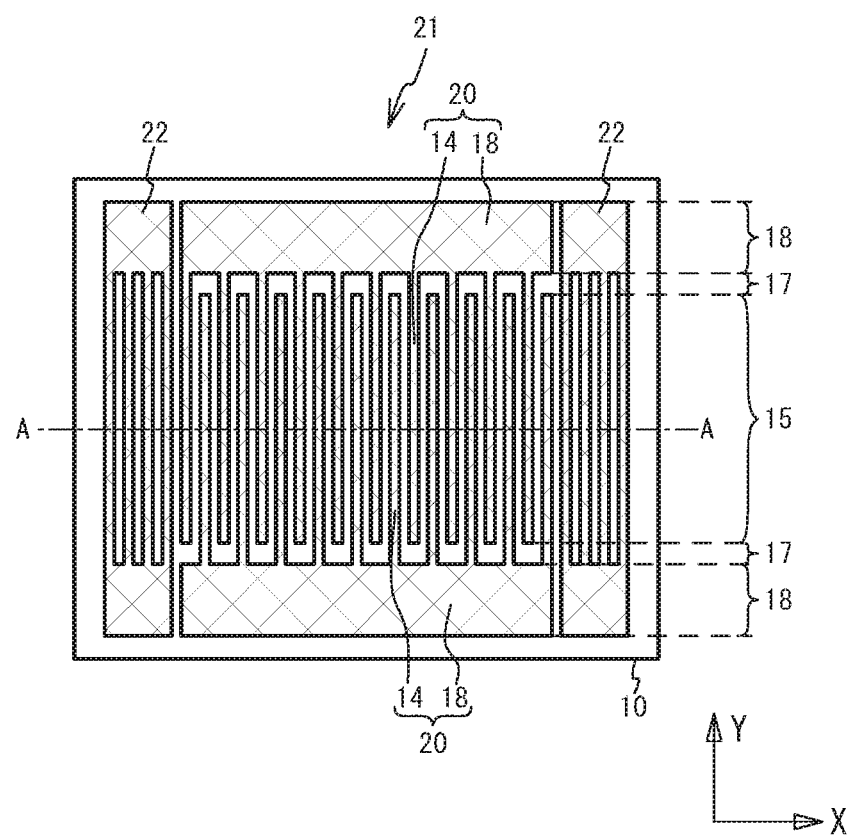
FIG. 1A is a plan view of an acoustic wave resonator in accordance with comparative examples and embodiments.
Figure 1B:
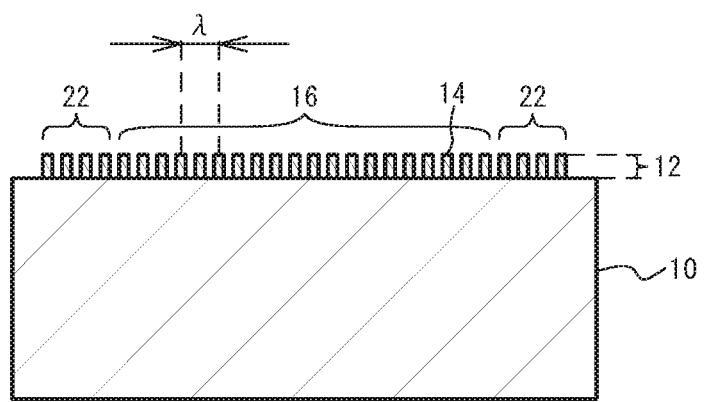
FIG. 1B is a cross-sectional view taken along line A-A in FIG. 1A.

A description will be given of a structure of an acoustic wave resonator in accordance with comparative examples and embodiments of the present invention. FIG. 1A is a plan view of an acoustic wave resonator in accordance with comparative examples and embodiments, and FIG. 1B is a cross-sectional view taken along line A-A in FIG. 1A. As illustrated in FIG. 1A and FIG. 1B, an IDT 21 and reflectors 22 are formed on a piezoelectric substrate 10. The IDT 21 and the reflectors 22 are formed of a metal film 12 formed on the piezoelectric substrate 10. The IDT 21 includes a pair of comb-shaped electrodes 20 facing each other. The comb-shaped electrode 20 includes a plurality of electrode fingers 14 and a bus bar 18 to which the electrode fingers 14 are coupled. The electrode fingers 14 form a grating electrode 16. A pair of the comb-shaped electrodes 20 are arranged so as to face each other so that the electrode fingers 14 of one of the comb-shaped electrodes 20 are alternated with the electrode fingers 14 of the other of the comb-shaped electrodes 20.

The region where the electrode fingers 14 of a pair of the comb-shaped electrodes 20 overlap in the arrangement direction is an overlap region 15. The acoustic wave excited by the grating electrode 16 in the overlap region 15 mainly propagates in the arrangement direction of the electrode fingers 14. The pitch of the electrode fingers 14 approximately corresponds to the wavelength λ of the acoustic wave. The region between the edges of the electrode fingers 14 of one of the comb-shaped electrodes 20 and the bus bar 18 of the other of the comb-shaped electrodes 20 is a gap region 17. When dummy electrode fingers are provided, the gap region is a region between the edges of the electrode fingers of one of the comb-shaped electrodes 20 and the edges of the dummy electrode fingers of the other of the comb-shaped electrodes 20. The propagation direction of the acoustic wave is defined as an X direction, and the direction perpendicular to the propagation direction is defined as a Y direction. The arrangement direction corresponds to the X direction. The X direction and the Y direction do not necessarily correspond to the X-axis direction and the Y-axis direction of the crystal orientation of the piezoelectric substrate 10, respectively. The piezoelectric substrate 10 is, for example, a lithium tantalate substrate or a lithium niobate substrate. The metal film 12 is, for example, an aluminum film or a copper film.

Figure 2A:
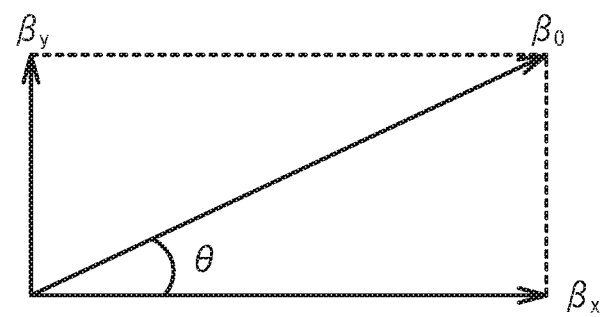
FIG. 2A is a plan view of wave numbers in an X direction and a Y direction.
Figure 2B:
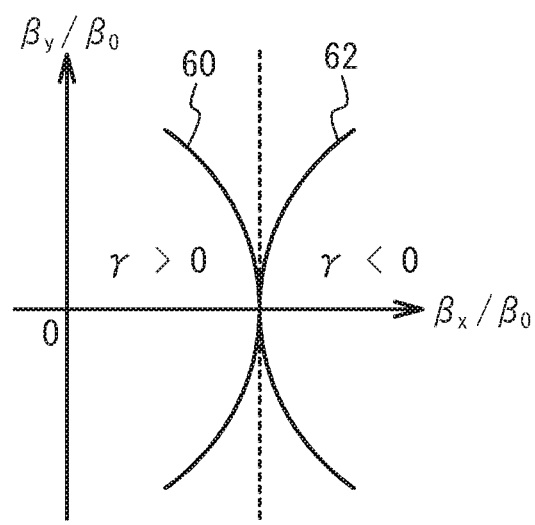
FIG. 2B is a graph of $\beta_y/\beta_0$ versus $\beta_x/\beta_0$.

Next, a description will be given of an anisotropy coefficient. FIG. 2A is a plan view of wave numbers in the X direction and the Y direction, and FIG. 2B is a graph of $\beta_y/\beta_0$ versus $\beta_x/\beta_0$. As illustrated in FIG. 2A, the wave number in the X direction of the acoustic wave is represented by $\beta_x$, and the wave number in the Y direction of the acoustic wave is represented by $\beta_y$. When the wave number $\beta_0$ of the acoustic wave in the direction at an angle θ from the X direction to the Y direction is assumed to be approximated by a parabola with respect to the angle θ, the wave number $\beta_0$ is expressed by $\beta_x^2 + \gamma \cdot \beta_y^2 = \beta_0^2$ with an anisotropy coefficient γ.

In FIG. 2B, $\beta_x/\beta_0$ corresponds to the slowness of the phase velocity of the acoustic wave in the X direction, and $\beta_y/\beta_0$ corresponds to the slowness of the phase velocity of the acoustic wave in the Y direction. When the anisotropy coefficient γ is positive, a slowness surface 60 has a convex shape as viewed from the origin. Thus, the state of γ>0 is also called a convex state. When the anisotropy coefficient γ is negative, a slowness surface 62 has a concave shape as viewed from the origin. Thus, the state of γ<0 is also called a concave state.

The anisotropy coefficient γ is determined by the material of the piezoelectric substrate 10, and the material, the film thickness, and the pitch of the grating electrode 16. For example, when the piezoelectric substrate 10 is a rotated Y-cut X-propagation lithium niobate substrate, the anisotropy coefficient γ is positive. When the piezoelectric substrate 10 is a rotated Y-cut X-propagation lithium tantalate substrate, the anisotropy coefficient γ is negative. When a rotated Y-cut X-propagation lithium tantalate substrate is used, and the grating electrode 16 is made of a heavy material and has a large film thickness, the anisotropy coefficient γ may be positive.

First Comparative Example

The case where the anisotropy coefficient γ is positive will be considered. In this case, when the anisotropy coefficient γ in the overlap region 15 decreases and becomes close to zero, the Y-direction component of the acoustic wave is hardly generated. When γ becomes zero, the Y-direction component of the acoustic wave becomes zero. Accordingly, the lateral-mode spurious disappears. As described above, as γ is reduced, the lateral-mode spurious is reduced. The inventors focused on the anisotropy coefficient γ and the reflectance in the grating electrode of the acoustic wave propagating in the X direction to reduce the lateral-mode spurious.

Figure 3A:
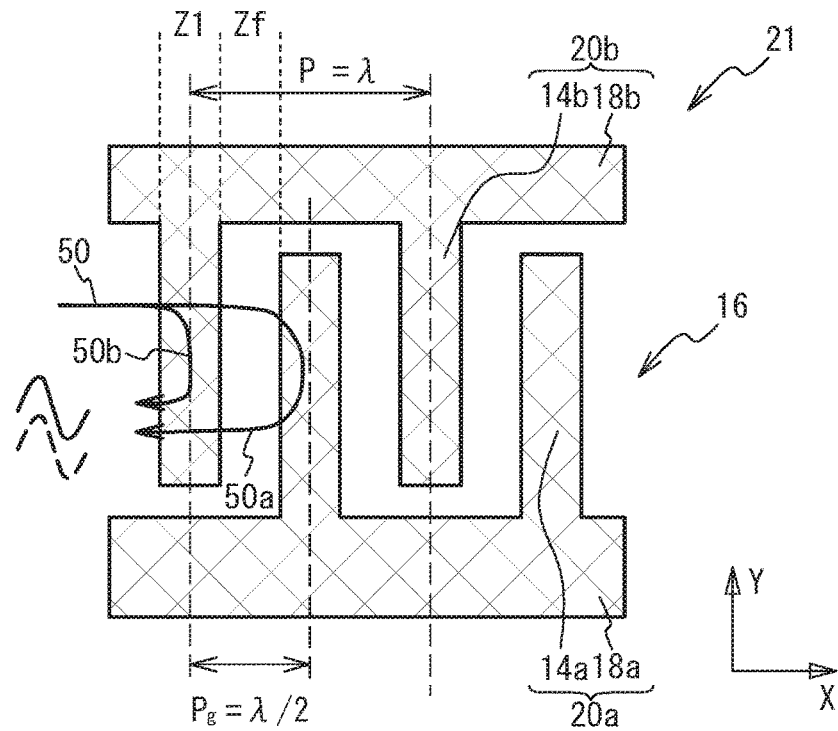
FIG. 3A and FIG. 3B are plan views illustrating a part of each IDT of acoustic wave resonators in accordance with first and second comparative examples, respectively.
Figure 3B:
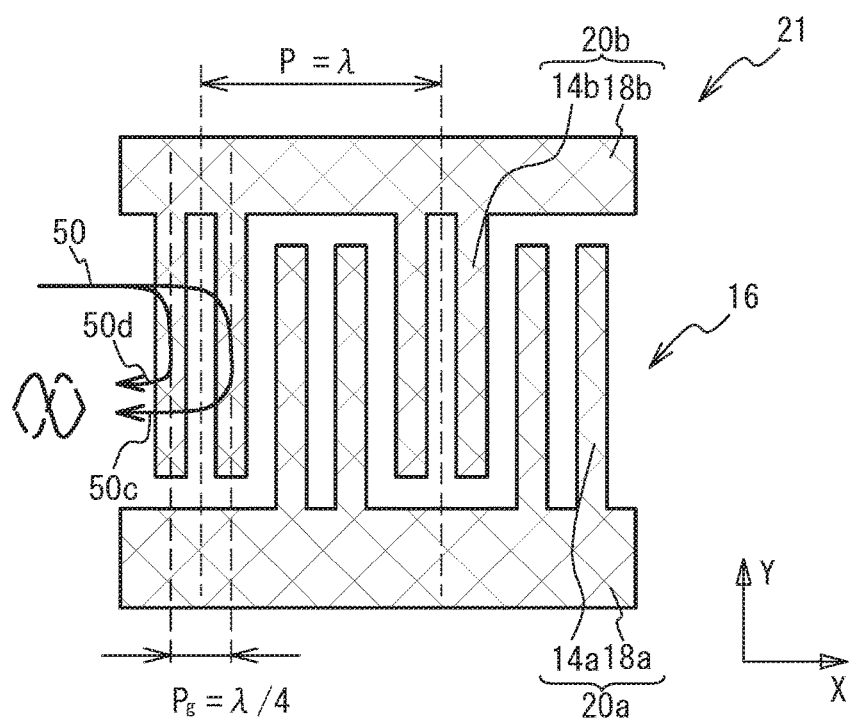

FIG. 3A and FIG. 3B are plan views illustrating a part of each IDT of acoustic wave resonators in accordance with first and second comparative examples. As illustrated in FIG. 3A, in the first comparative example, one electrode finger 14a of a comb-shaped electrode 20a is located between adjacent electrode fingers 14b of a comb-shaped electrode 20b. One electrode finger 14b is located between the adjacent electrode fingers 14a. This structure will be called a single electrode. The pitch P between the centers of the adjacent electrode fingers 14b of the same comb-shaped electrode 20b approximately corresponds to the wavelength λ of the acoustic wave excited by the grating electrode. The pitch Pg between the centers of the adjacent electrode fingers 14a and 14b is λ/2. Acoustic impedance Z1 in the electrode fingers 14a and 14b is greater than acoustic impedance Zf in a region between the electrode fingers 14a and 14b. Accordingly, the acoustic wave propagating through the grating electrode 16 in the X direction is reflected by the electrode fingers 14a and 14b. Since the pitch Pg is λ/2, acoustic waves 50a and 50b respectively reflected by the electrode fingers 14a and 14b have approximately the same phase. Therefore, the reflectance of an acoustic wave 50 by the grating electrode 16 becomes large.

Second Comparative Example

The second comparative example reduces the reflection of the acoustic wave by the grating electrode. As illustrated in FIG. 3B, in the second comparative example, two electrode fingers 14a are located between the adjacent electrode fingers 14b. Two electrode fingers 14b are located between the adjacent electrode fingers 14a. This structure will be called a double electrode. As described above, two electrode fingers 14a and two electrode fingers 14b are alternated with each other. The pitch Pg of the most adjacent electrode fingers 14a (or 14b) is λ/4. In this case, the reflection of the acoustic wave meets Bragg's condition. In Bragg's condition, acoustic waves 50c and 50d generated when the acoustic wave 50 propagating in the X direction are reflected by the adjacent electrode fingers 14b have opposite phases. Accordingly, the reflectance of the acoustic wave by the grating electrode 16 becomes small (identically becomes zero).

One-port resonators in accordance with the first and second comparative examples were fabricated to measure the reflection characteristic S11. The fabricated one-port resonators have the following structure.

Piezoelectric substrate 10: Rotated 42° Y-cut X-propagation lithium tantalate substrate
Metal film 12: Molybdenum (Mo) film with a film thickness Tg of 0.11λ
Pitch P=λ: 4.4 μm
Overlap width: 20λ
Number of pairs: 100 pairs
Number of reflector electrode fingers: 10

The pitch P represents a pitch of the electrode fingers of the same comb-shaped electrode. The overlap width represents a width of the overlap region 15 in the Y direction (a width along which the electrode fingers 14 overlap). The number of pairs is the number of pairs of the electrode fingers 14 in the grating electrode 16. The number of reflector electrode fingers represents the number of electrode fingers of the reflector 22.

Figure 4A:
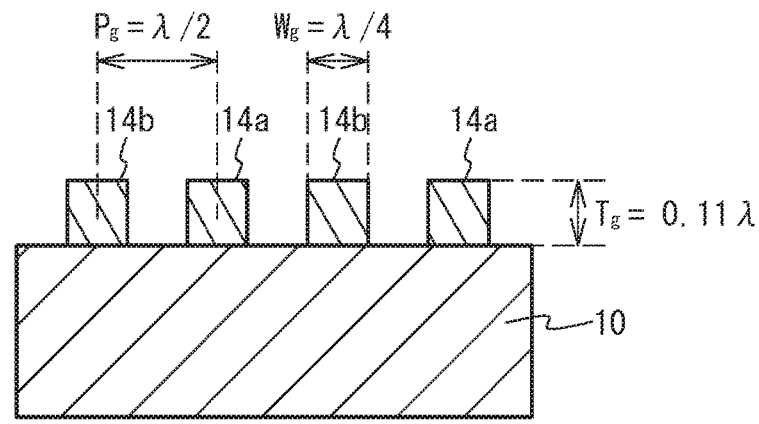
FIG. 4A is a cross-sectional view of the first comparative example.
Figure 4B:
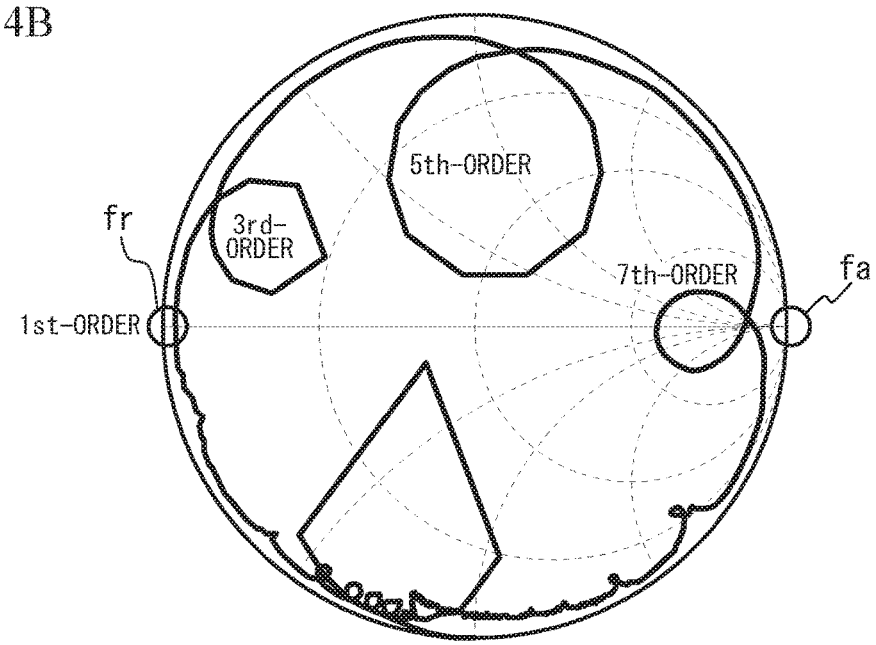
FIG. 4B is a Smith chart illustrating a reflection characteristic S11 of a one-port resonator.

FIG. 4A is a cross-sectional view of the first comparative example, and FIG. 4B is a Smith chart illustrating the reflection characteristic S11 of a one-port resonator. As illustrated in FIG. 4A, the piezoelectric substrate 10 is a rotated 42° Y-cut X-propagation lithium tantalate substrate. The electrode fingers 14a and 14b are alternately arranged on the piezoelectric substrate 10. The electrode fingers 14a and 14b have film thicknesses Tg of 0.11λ. The pitch Pg of the adjacent electrode fingers 14a and 14b is λ/2. The electrode fingers 14a and 14b have widths Wg of λ/4.

As illustrated in FIG. 4B, from the resonant frequency fr to the antiresonant frequency fa, large first-order spurious to seventh-order spurious are generated. S11 is located near the periphery of the Smith chart, which means that the Q-circle is large. Thus, the loss is small, and the Q-value is large. As described above, in the first comparative example, the loss is small, but the lateral-mode spurious is large.

Figure 5A:
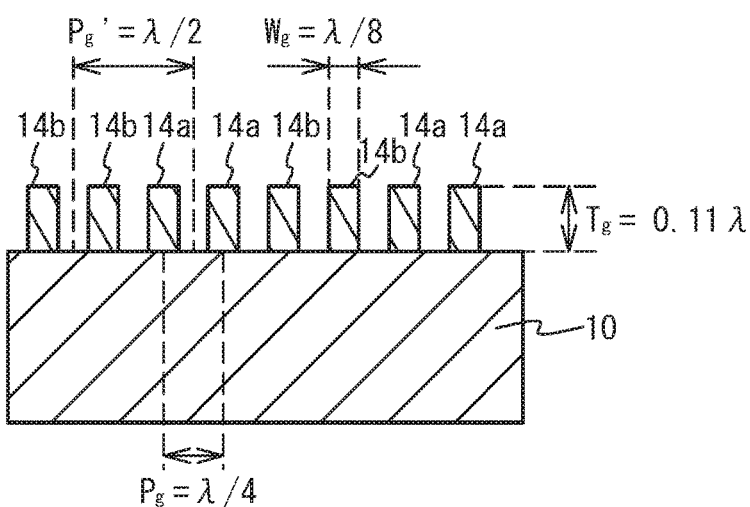
FIG. 5A is a cross-sectional view of the second comparative example.
Figure 5B:
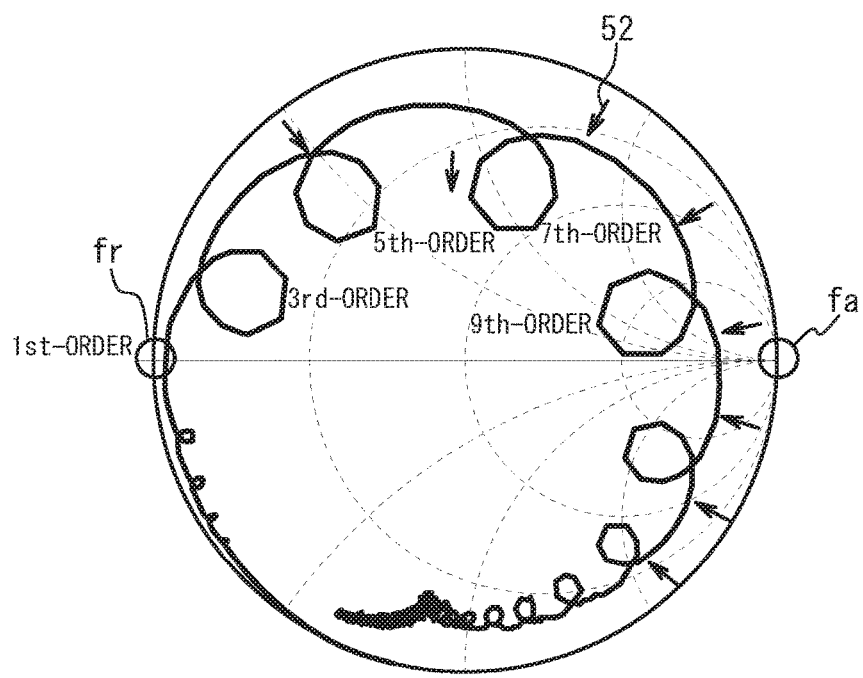
FIG. 5B is a Smith chart illustrating the reflection characteristic S11 of a one-port resonator.

FIG. 5A is a cross-sectional view of the second comparative example, and FIG. 5B is a Smith chart illustrating the reflection characteristic S11 of a one-port resonator. As illustrated in FIG. 5A, two electrode fingers 14a and two electrode fingers 14b are alternately arranged on the piezoelectric substrate 10. The pitch Pg' between the center between the two electrode fingers 14a and the center between the two electrode fingers 14b is λ/2. The pitch Pg between two electrode fingers 14a (or 14b) is λ/4. The electrode fingers 14a and 14b have widths Wg of λ/8.

As illustrated in FIG. 5B, from the resonant frequency fr to the antiresonant frequency fa, circles of first-order spurious to ninth-order and higher-order spurious are generated, but the spurious is smaller than that of the first comparative example. As indicated by arrows 52, S11 are farther from the periphery of the Smith chart, which means that the Q-circle are smaller. Thus, the loss increases and the Q-value decreases. As described above, in the second comparative example, the lateral-mode spurious is small but the loss is large compared to those in the first comparative example.

The reason why the loss increases in the second comparative example is considered because the energy of the acoustic wave cannot be confined in the IDT 21 since the acoustic wave are hardly reflected by the grating electrode 16.

First Embodiment

Figure 6A:
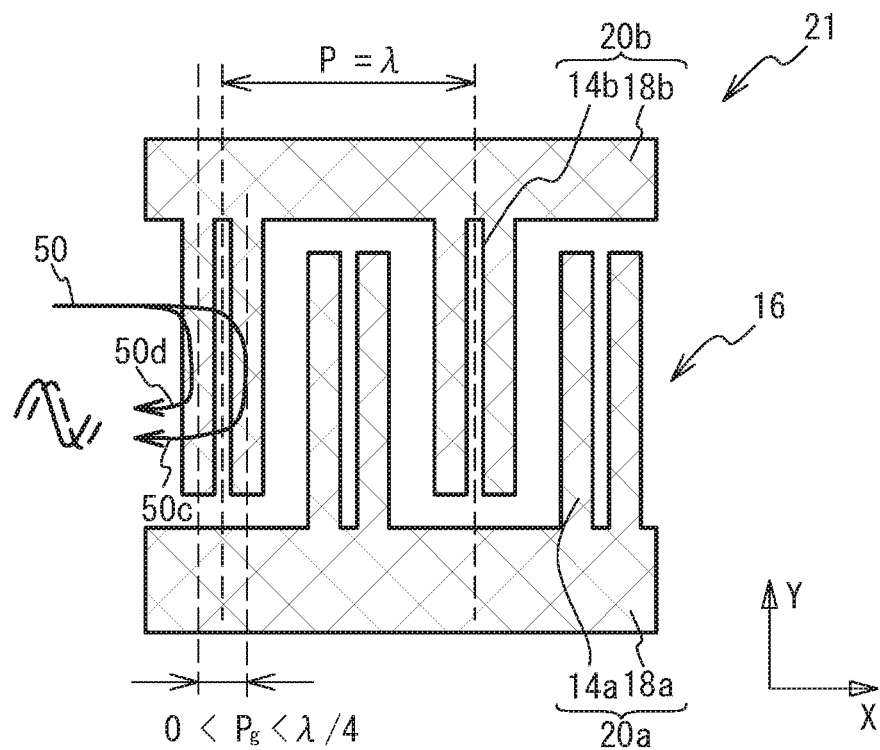
FIG. 6A and FIG. 6B are plan views illustrating a part of an IDT of an acoustic wave resonator in accordance with a first embodiment.
Figure 6B:
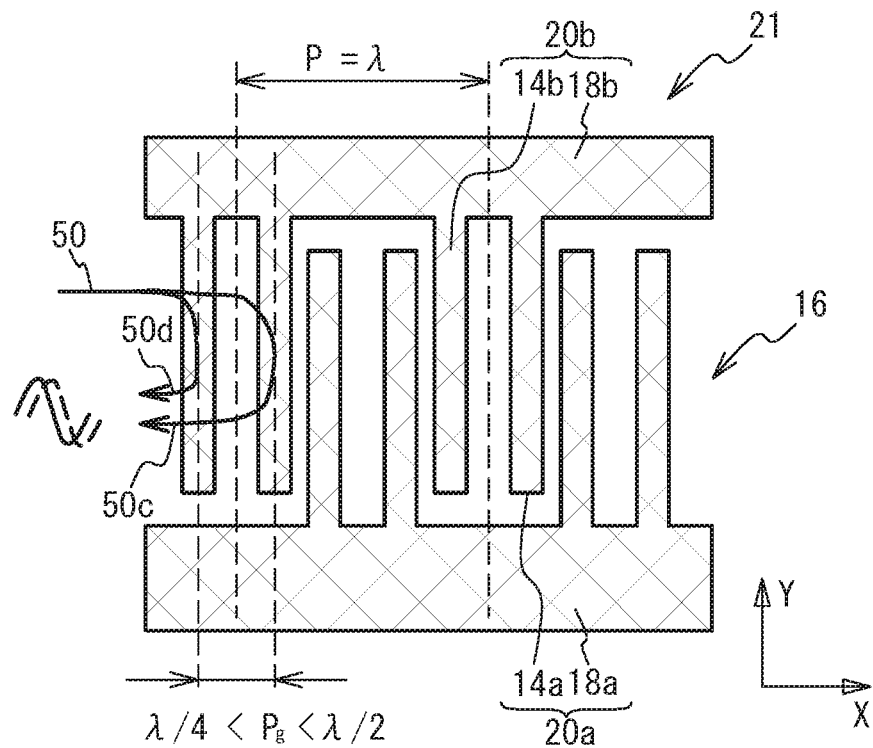

FIG. 6A and FIG. 6B are plan views illustrating a part of an IDT of an acoustic wave resonator in accordance with a first embodiment. As illustrated in FIG. 6A, the first embodiment uses the double electrode. The pitch Pg of the two adjacent electrode fingers 14a (or 14b) is configured to be less than λ/4. As illustrated in FIG. 6B, the pitch Pg of the two adjacent electrode fingers 14a (or 14b) is configured to be greater than λ/4. Other structures are the same as those of the second comparative example, and the description thereof is thus omitted.

In the first embodiment, the pitch Pg is configured to differ from λ/4. In this case, the reflection of the acoustic wave does not meet Bragg's condition. The acoustic waves 50c and 50d generated when the acoustic waves 50 propagating in the X direction are reflected by the adjacent electrode fingers 14b have different phases that are not opposite or identical. Thus, the reflectance of the acoustic wave by the grating electrode 16 in the first embodiment is less than that in the first comparative example. Therefore, the anisotropy coefficient γ is less than that of the first comparative example, and the lateral-mode spurious is therefore reduced. Additionally, the reflectance of the acoustic wave of the first embodiment is greater than that of the second comparative example. Therefore, the energy of the acoustic wave is confined in the IDT 21, and the increase in loss is reduced.

Figure 7A:
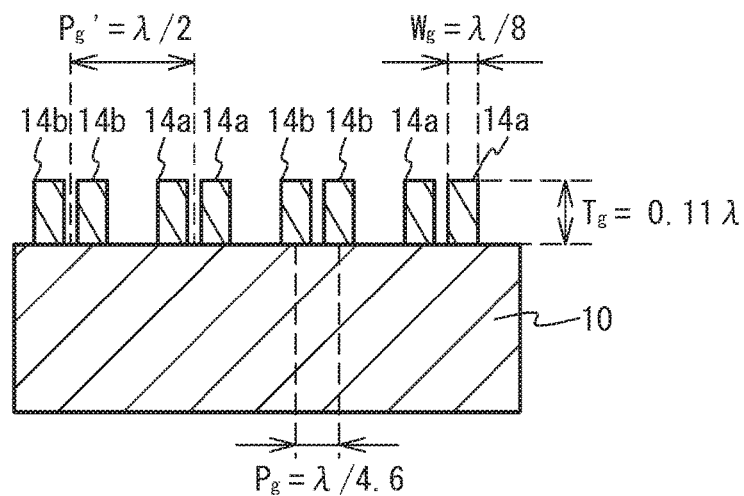
FIG. 7A is a cross-sectional view of the first embodiment.
Figure 7B:
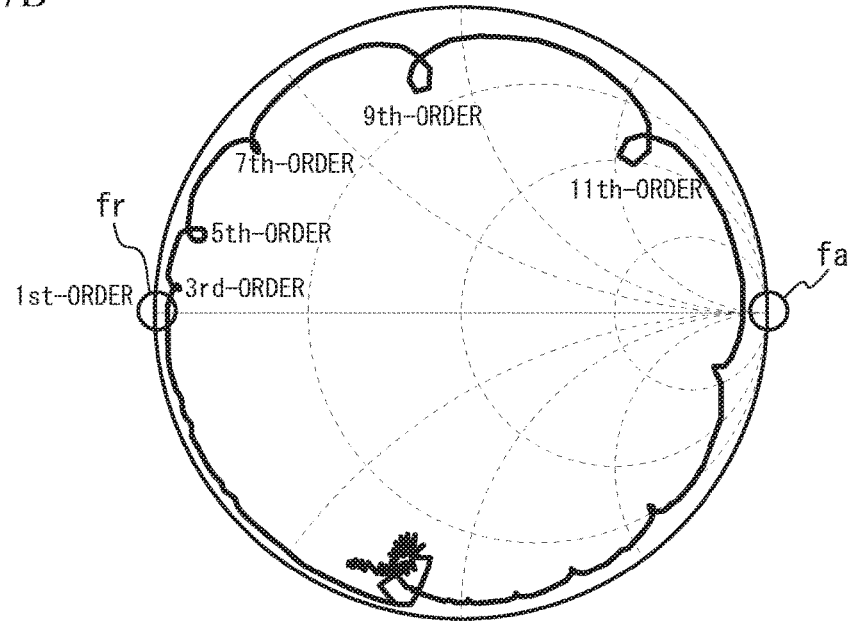
FIG. 7B is a Smith chart illustrating the reflection characteristic S11 of a one-port resonator.

An acoustic wave resonator having the structure of FIG. 6A was fabricated to measure the reflection characteristic S11. FIG. 7A is a cross-sectional view of the first embodiment, and FIG. 7B is a Smith chart illustrating the reflection characteristic S11 of a one-port resonator. As illustrated in FIG. 7A, the pitch Pg' between the center between the two electrode fingers 14a and the center between the two electrode fingers 14b is λ/2. The pitch Pg between the two electrode fingers 14a (or 14b) is λ/4.6. The electrode fingers 14a and 14b have widths Wg of λ/8. Other simulation conditions are the same as those of the first and second comparative examples.

As illustrated in FIG. 7B, compared to the second comparative example, S11 is located near the periphery of the Smith chart. As seen above, the first embodiment has less loss than the second comparative example. Thus, the Q-value is higher. From the resonant frequency fr to the antiresonant frequency fa, circles of first-order spurious to eleventh-order spurious are generated. The magnitude of spurious is less than those of the first and second comparative examples. As described above, the loss and the spurious are reduced.

Figure 8A:
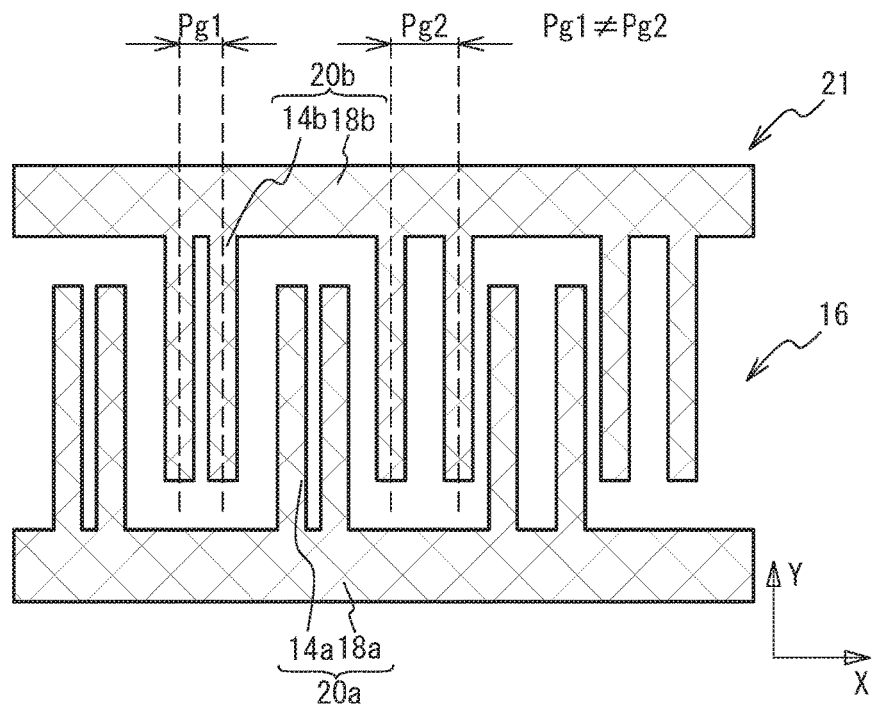
FIG. 8A through FIG. 8C are plan views illustrating a part of each IDT of acoustic wave resonators in accordance with variations of the first embodiment.
Figure 8B:
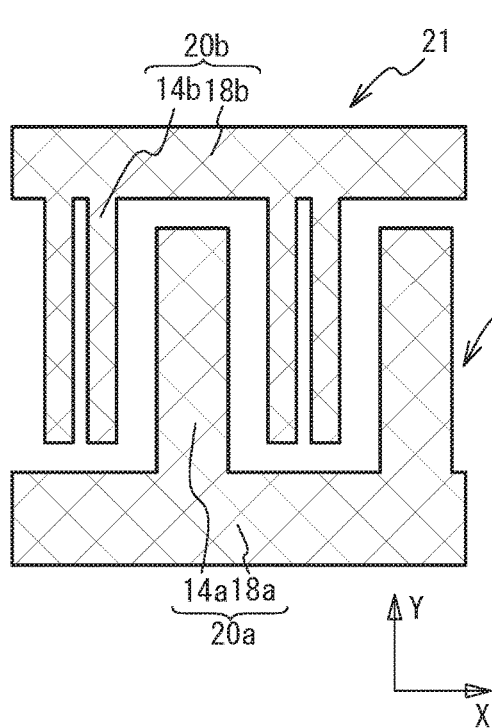
Figure 8C:
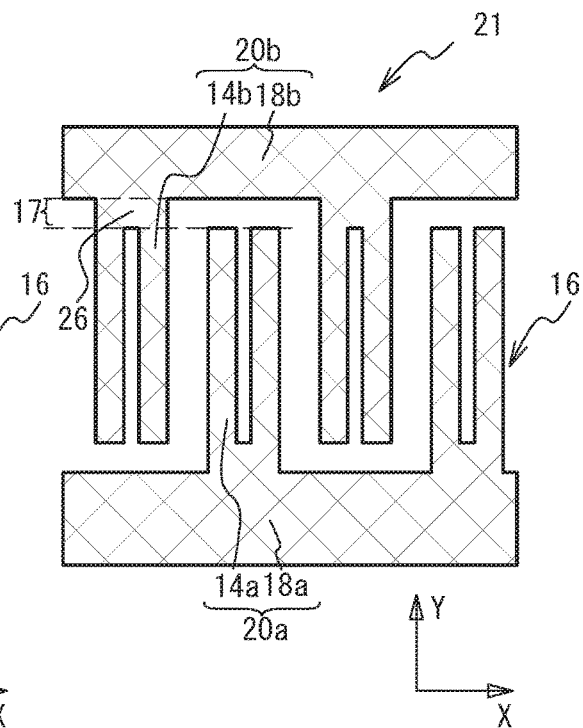

FIG. 8A through FIG. 8C are plan views illustrating a part of each IDT of acoustic wave resonators in accordance with variations of the first embodiment. As illustrated in FIG. 8A, there are a section in which the pitch of the adjacent electrode fingers 14a (or 14b) is set to a pitch Pg1, and a section in which the pitch of the adjacent electrode fingers 14a (or 14b) is set to a pitch Pg2 different from Pg1. As described above, the pitch Pg may be varied in the X direction. As illustrated in FIG. 8B, one of the electrode fingers 14a and 14b may be the single electrode. As illustrated in FIG. 8C, the gap region 17 may not necessarily have a double electrode structure because the gap region 17 does not contribute to the excitation of the acoustic wave.

In the first embodiment and the variations thereof, the grating electrode 16 includes a plurality of electrode fingers 14a (first electrode fingers) having electric potentials equal to each other and a plurality of electrode fingers 14b (second electrode fingers) having electric potentials equal to each other. The electrode fingers 14a and 14b are respectively included in different comb-shaped electrodes 20a and 20b. Therefore, the electrode fingers 14a have electric potentials different from the electric potentials of the electrode fingers 14b. Two electrode fingers 14b are located between at least a pair of the adjacent electrode fingers 14a. When the distance between the centers of the two electrode fingers 14b is represented by Pg, Pg differs from $\lambda/4$. By using the double electrode, the reflectance of the acoustic wave by the grating electrode 16 is reduced compared to the first comparative example. Accordingly, the anisotropy coefficient $\gamma$ becomes smaller, and the lateral-mode spurious is therefore reduced. Furthermore, by configuring the pitch Pg to be different from $\lambda/4$, the no-reflection state described in the second comparative example disappears. Therefore, the loss is reduced and the Q-value is improved.

In FIG. 6A, if Pg becomes less than $\lambda/8$, the electrode fingers 14b come in contact with each other. Thus, Pg preferably meets the condition of $\lambda/8<Pg<\lambda/4$. Pg more preferably meets the condition of $3\lambda/16<Pg$. Pg preferably meets the condition of $Pg<\lambda/4.2$, more preferably $Pg<\lambda/4.4$.

In FIG. 6B, if Pg becomes greater than $3\lambda/8$, the electrode fingers 14b and 14a come in contact with each other. Thus, Pg preferably meets the condition of $\lambda/4<Pg<3\lambda/8$. Pg more preferably meets the condition of $Pg<5\lambda/16$. Pg preferably meets the condition of $\lambda/3.8<Pg$, more preferably $\lambda/3.6<Pg$.

Both the electrode fingers 14a and 14b are preferably the double electrodes, but one of them may be the single electrode. All the electrode fingers 14a (or 14b) are preferably the double electrodes, but it is sufficient if at least one electrode finger is the double electrode.

Second Embodiment

Figure 9A:
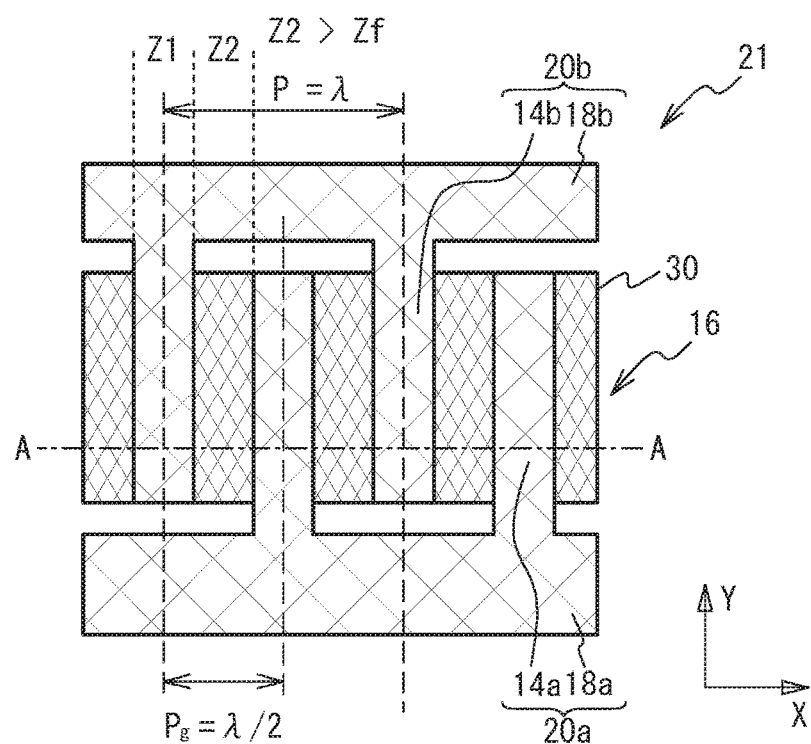
FIG. 9A is a plan view illustrating a part of an IDT of an acoustic wave resonator in accordance with a second embodiment.
Figure 9B:
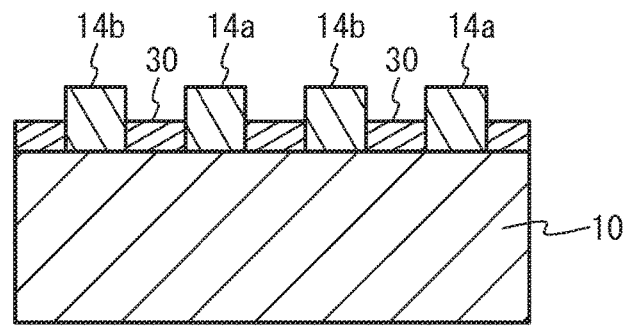
FIG. 9B is a cross-sectional view taken along line A-A.

A second embodiment provides a metal additional film between the electrode fingers 14a and 14b in the overlap region 15 to reduce the reflectance of the acoustic wave by the grating electrode 16. FIG. 9A is a plan view illustrating a part of an IDT of an acoustic wave resonator in accordance with the second embodiment, and FIG. 9B is a cross-sectional view taken along line A-A. As illustrated in FIG. 9A and FIG. 9B, a metal additional film 30 is located on the piezoelectric substrate 10 between the electrode fingers 14a and 14b. The metal additional film 30 has a density greater than the density of an insulating film such as a protective film. Thus, acoustic impedance Z2 in a region located between the electrode fingers 14a and 14b and including the metal additional film 30 is greater than the acoustic impedance Zf in a region without the metal additional film 30 like the first comparative example. Therefore, the difference between the acoustic impedance Z1 and Z2 of the electrode fingers 14a and 14b is less than the difference between the acoustic impedance Z1 and Zf of the first comparative example. Accordingly, the reflectance of the acoustic wave by the grating electrode 16 is less than that of the first comparative example.

Figure 10A:
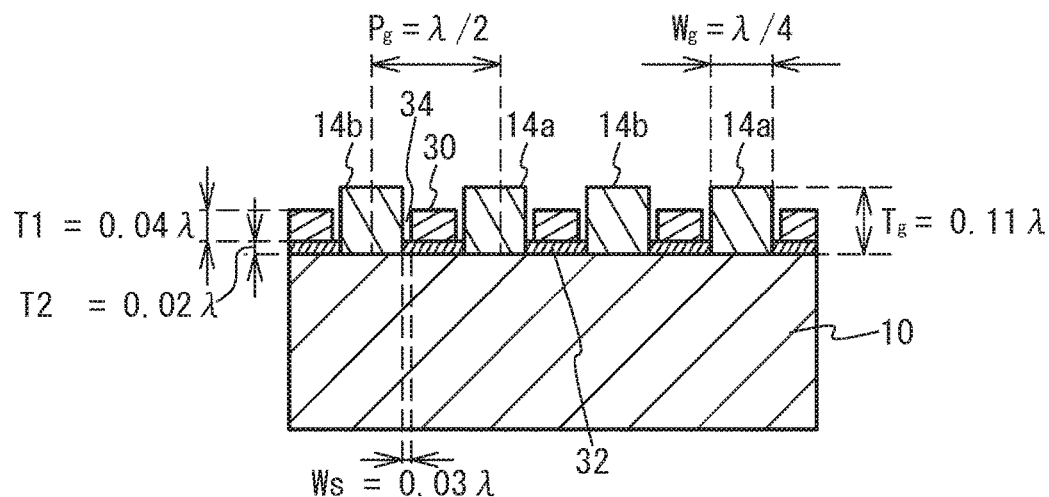
FIG. 10A is a cross-sectional view of the second embodiment.
Figure 10B:
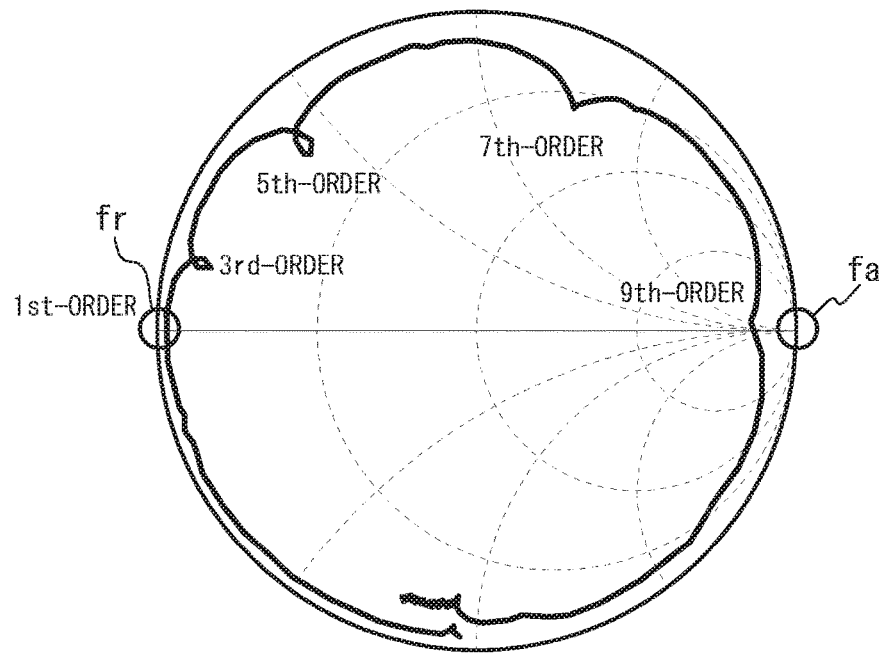
FIG. 10B is a Smith chart illustrating the reflection characteristic S11 of a one-port resonator.

The acoustic wave resonator of the second embodiment was fabricated to measure the reflection characteristic S11. FIG. 10A is a cross-sectional view of the second embodiment, and FIG. 10B is a Smith chart illustrating the reflection characteristic S11 of a one-port resonator. As illustrated in FIG. 10A, an insulating film 32 is located on the piezoelectric substrate 10 between the electrode fingers 14a and 14b. The metal additional film 30 is located on the insulating film 32. The insulating film 32 is a silicon oxide ($SiO_2$) film with a film thickness T2 of $0.02\lambda$. The metal additional film 30 is an Au film with a film thickness T1 of $0.04\lambda$. Spaces 34 between the electrode fingers 14a and 14b and the metal additional film 30 are an air gap, and have widths Ws of $0.03\lambda$.

As illustrated in FIG. 10B, from the resonant frequency fr to the antiresonant frequency fa, circles of first-order spurious to ninth-order spurious are generated. The magnitude of the spurious is less than those of the first and second comparative examples. Compared to the second comparative example, S11 is located near the periphery of the Smith chart. As seen above, the second embodiment has less loss than the second comparative example. Accordingly, the Q-value is higher. As described above, the loss and the spurious are reduced.

The acoustic impedance Z [$kg/(m^2 \cdot s)$] of each material is expressed by the following equation.

$$Z = V \times \rho = \sqrt{\rho \times E}$$

Here, E [Pa] represents Young's modulus, $\rho$ [$kg/m^3$] represents density, and V [$kg/(m^2\ s)$] represents acoustic velocity. As described above, the acoustic impedance is the square root of the product of Young's modulus E and density $\rho$.

Young's modulus, the density, and the acoustic impedance of each of Mo, the air, and Au are listed in Table 1.

TABLE 1

|  | Mo | Air [1 atm, 20° C.] | Au |
| --- | --- | --- | --- |
| Young's modulus E [Pa] | $329 \times 10^9$ | $1.4 \times 10^5$ | $70 \times 10^9$ |
| Density $\rho$ [$kg/m^3$] | $1.028 \times 10^4$ | 1.20 | $1.93 \times 10^4$ |
| Acoustic impedance [$kg/(m^2 \cdot s)$] | $58 \times 10^6$ | $0.4 \times 10^3$ | $36.7 \times 10^6$ |

The acoustic impedance Z1 and Z2 in FIG. 10A is affected by not only the acoustic impedance of the material but also the film thickness. The acoustic impedance of Au is less than that of Mo, and the film thickness of the metal additional film 30 is less than those of the electrode fingers 14a and 14b. Thus, Z2<Z1. Accordingly, the reflectance of the acoustic wave becomes less than that of the first comparative example. On the other hand, the acoustic impedance of Au is greater than that of the air. Thus, Zf<Z2. Accordingly, the reflectance of the acoustic wave is greater than zero. Therefore, as in the first embodiment, the loss and the lateral-mode spurious are reduced.

Figure 11A:
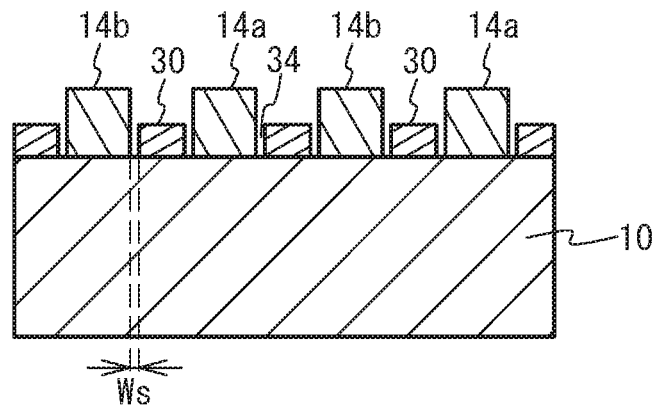
FIG. 11A through FIG. 11C are cross-sectional views illustrating a part of each IDT of acoustic wave resonators in accordance with variations of the second embodiment.
Figure 11B:
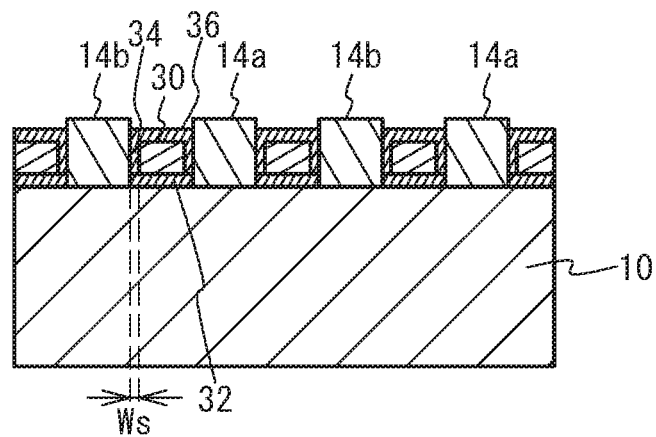
Figure 11C:
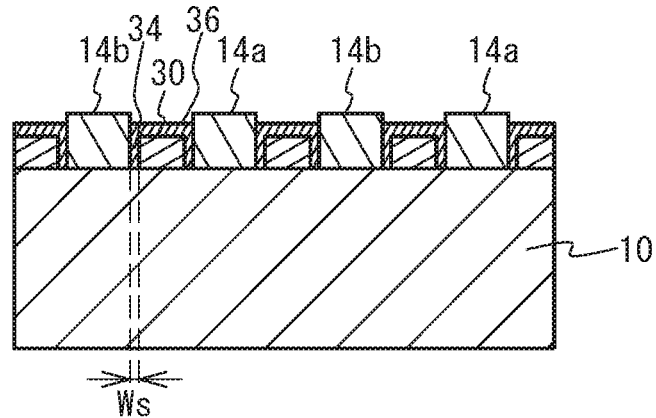

FIG. 11A through FIG. 11C are cross-sectional views illustrating a part of each IDT of acoustic wave resonators in accordance with variations of the second embodiment. As illustrated in FIG. 11A, the insulating film 32 may not be necessarily located between the metal additional film 30 and the piezoelectric substrate 10. As illustrated in FIG. 11B, an insulating film 36 may be located so as to cover the metal additional film 30 and fill the spaces 34. As illustrated in FIG. 11C, the insulating film 32 may not be necessarily located, and the insulating film 36 may be located. The insulating films 32 and 36 may be made of silicon nitride or silicon oxynitride, instead of silicon oxide.

In the second embodiment and the variations thereof, the metal additional film 30 is formed between a plurality of the electrode fingers 14a and 14b in the overlap region 15, and is not electrically coupled to the plurality of the electrode fingers 14a and 14b. This structure reduces the reflectance of the acoustic wave by the grating electrode 16. Thus, the anisotropy coefficient γ decreases, and the lateral-mode spurious is thereby reduced. The metal additional film 30 has a greater density than the insulating film. Thus, the acoustic impedance is greater. Thus, even though the film thickness is not increased, the acoustic impedance Z2 can be increased. In addition, the reflectance of the acoustic wave becomes greater than zero by making the acoustic impedance Z2 and Z1 different from each other, and therefore, the loss is reduced.

The preferable range of Z2 is Zf<Z2<Z1 or Z1<Z2<Z1+ (Z1−Zf). To avoid the increase in the film thickness of the metal additional film 30, Zf<Z2<Z1 is preferable. It is sufficient if the metal additional film 30 is located in at least a part of the overlap region 15. To elicit the effect more, the metal additional film 30 is preferably located across the entire of the overlap region 15.

When the metal additional film 30 comes in contact with the electrode fingers 14a and 14b, they are electrically connected. On the other hand, when the distance between the metal additional film 30 and the electrode finger 14a or 14b is large, the effect produced by the provision of the metal additional film 30 becomes small. Thus, the distance Ws between the metal additional film 30 and the electrode finger 14a (or 14b) adjacent to the metal additional film 30 is preferably less than $\lambda/16$. The distance Ws is more preferably less than $\lambda/32$.

Third Embodiment

Figure 12A:
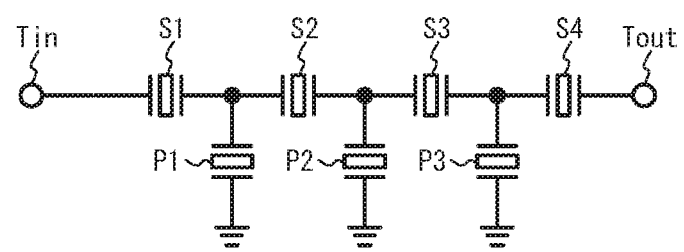
FIG. 12A is a circuit diagram of a filter in accordance with a third embodiment.

A third embodiment is an exemplary filter and an exemplary duplexer using the acoustic wave resonator in accordance with any of the first and second embodiments and the variations thereof. FIG. 12A is a circuit diagram of a filter in accordance with the third embodiment. As illustrated in FIG. 12A, one or more series resonators S1 through S4 are connected in series between an input terminal Tin and an output terminal Tout. One or more parallel resonators P1 through P3 are connected in parallel between the input terminal Tin and the output terminal Tout. At least one of one or more series resonators S1 through S4 and one or more parallel resonators P1 through P3 may be the acoustic wave resonator of any one of the first and second embodiments and the variations thereof. The filter including the acoustic wave resonator of any one of the first and second embodiments and the variations thereof may be a multimode filter as well as a ladder-type filter.

Figure 12B:
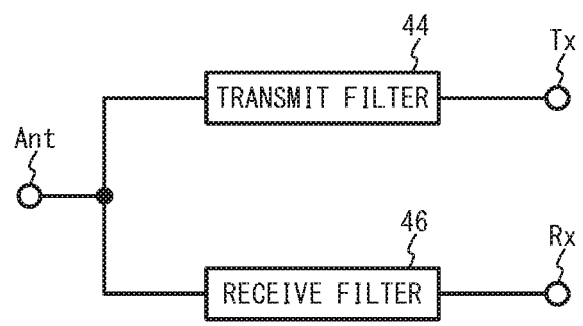
FIG. 12B is a circuit diagram of a duplexer in accordance with a variation of the third embodiment.

FIG. 12B is a circuit diagram of a duplexer in accordance with a variation of the third embodiment. As illustrated in FIG. 12B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 and the receive filter 46 can be the filter of the third embodiment.

A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave resonator comprising:
a piezoelectric substrate; and
a pair of grating electrodes that is formed on the piezoelectric substrate, one of the pair of grating electrodes including a plurality of first electrode fingers having electric potentials equal to each other, another of the pair of grating electrodes including a plurality of second electrode fingers having electric potentials that differ from the electric potentials of the plurality of first electrode fingers and are equal to each other, two second electrode fingers of the plurality of second electrode fingers being located between at least a pair of adjacent first electrode fingers of the plurality of first electrode fingers, wherein $\lambda/8 < Pg < \lambda/4$ or $\lambda/4 < Pg < 3 \times \lambda/8$ where $\lambda$ represents a wavelength of an acoustic wave excited by the plurality of first electrode fingers and the plurality of second electrode fingers and Pg represents a distance between centers of the two second electrode fingers.

2. The acoustic wave resonator according to claim 1, wherein, Pg is satisfied by $$\lambda/8 < Pg < \lambda/4.$$

3. The acoustic wave resonator according to claim 1, wherein, Pg is satisfied by $$\lambda/4 < Pg < 3 \times \lambda/8.$$

4. The acoustic wave resonator according to claim 1, wherein
two first electrode fingers are located between at least a pair of adjacent second electrode fingers, and
a distance between centers of the two first electrode fingers differs from $\lambda/4$.

5. A filter comprising:
the acoustic wave resonator according to claim 1.

6. A multiplexer comprising:
the filter according to claim 5.

7. The acoustic wave resonator according to claim 1, wherein
an anisotropy coefficient in an overlap region where the plurality of first electrode fingers and the plurality of second electrode fingers overlap is positive.

8. An acoustic wave resonator comprising:
a piezoelectric substrate;
a pair of grating electrodes that is formed on the piezoelectric substrate and includes a plurality of electrode fingers arranged in an arrangement direction, the plurality of electrode fingers exciting an acoustic wave; and
a metal film that is formed on the piezoelectric substrate between the plurality of electrode fingers in an overlap region where the plurality of electrode fingers overlap in the arrangement direction, the metal film being not electrically coupled to the plurality of electrode fingers and not overlapping with the plurality of electrode fingers in a plan view.

9. The acoustic wave resonator according to claim 8, wherein a distance between the metal film and an electrode finger adjacent to the metal film among the plurality of electrode fingers is less than $\lambda/16$ where $\lambda$ represents a wavelength of an acoustic wave excited by the plurality of electrode fingers.

10. The acoustic wave resonator according to claim 8, wherein
an anisotropy coefficient in an overlap region where the plurality of electrode fingers overlap is positive.

11. A filter comprising:
the acoustic wave resonator according to claim 8.

12. A multiplexer comprising:
the filter according to claim 11.

* * * * *